United States Patent
Rompaey et al.

(10) Patent No.: US 9,471,727 B2
(45) Date of Patent: Oct. 18, 2016

(54) SIMULATION WITH DYNAMIC RUN-TIME ACCURACY ADJUSTMENT

(71) Applicant: Synopsys, Inc., Mountain View, CA (US)

(72) Inventors: Karl Van Rompaey, Nieuwpoort (BE); Andreas Wieferink, Aachen (DE)

(73) Assignee: Synopsys, Inc., Mountain View, CA (US)

( * ) Notice: Subject to any disclaimer, the term of this patent is extended or adjusted under 35 U.S.C. 154(b) by 550 days.

(21) Appl. No.: 13/974,735

(22) Filed: Aug. 23, 2013

(65) Prior Publication Data

US 2013/0346046 A1  Dec. 26, 2013

Related U.S. Application Data

(63) Continuation of application No. 11/707,412, filed on Feb. 16, 2007, now Pat. No. 8,543,367.

(60) Provisional application No. 60/774,947, filed on Feb. 16, 2006.

(51) Int. Cl.
   G06F 9/45 (2006.01)
   G06F 17/50 (2006.01)
   G06F 11/26 (2006.01)

(52) U.S. Cl.
   CPC ......... G06F 17/5009 (2013.01); G06F 11/261 (2013.01); G06F 17/5031 (2013.01)

(58) Field of Classification Search
   CPC ............ G06F 11/261; G06F 17/5009; G06F 17/5031
   See application file for complete search history.

(56) References Cited

U.S. PATENT DOCUMENTS

| | | |
|---|---|---|
| 4,051,352 A | 9/1977 | Eichelberger et al. |
| 5,371,746 A | 12/1994 | Yamashita et al. |
| 5,410,685 A | 4/1995 | Banda et al. |
| 5,452,437 A | 9/1995 | Richey et al. |
| 5,784,552 A | 7/1998 | Bishop et al. |
| 5,790,778 A | 8/1998 | Bush et al. |

(Continued)

FOREIGN PATENT DOCUMENTS

| | | |
|---|---|---|
| KR | 100257516 | 6/2000 |
| KR | 20030058128 | 7/2003 |
| WO | WO 2005/055094 | 6/2005 |

OTHER PUBLICATIONS

Liu et al., "Software timing analysis using HW/SW cosimulation and instruction set simulator", IEEE 1998.*

(Continued)

*Primary Examiner* — Kandasamy Thangavelu
(74) *Attorney, Agent, or Firm* — Fenwick & West LLP

(57) ABSTRACT

Systems and methods for simulation with dynamic run-time accuracy adjustment. In one embodiment, a first portion of a sequence of software instruction is simulated by a first simulation model, during a simulation. During the same simulation, a second portion of the sequence is simulated by a second simulation model. State information may be transferred from the first simulation model to the second simulation model. A change from simulating the first portion of a sequence of software instructions by the first simulation model to simulating the second portion of the sequence by the second simulation model may be made responsive to a computer-based determination of an advantage obtained by the change.

20 Claims, 8 Drawing Sheets

(56) References Cited

U.S. PATENT DOCUMENTS

| | | | |
|---|---|---|---|
| 5,819,093 | A | 10/1998 | Davidson et al. |
| 5,911,073 | A | 6/1999 | Mattson, Jr. et al. |
| 6,083,281 | A | 7/2000 | Diec et al. |
| 6,145,099 | A | 11/2000 | Shindou |
| 6,167,479 | A | 12/2000 | Hartnett et al. |
| 6,418,392 | B1 | 7/2002 | Rust et al. |
| 6,453,424 | B1 | 9/2002 | Janniello |
| 6,516,460 | B1 | 2/2003 | Merks et al. |
| 6,587,995 | B1 | 7/2003 | Duboc et al. |
| 6,601,229 | B1 | 7/2003 | Niederer et al. |
| 6,625,572 | B1 | 9/2003 | Zemlyak et al. |
| 6,718,294 | B1 | 4/2004 | Bortfeld |
| 6,760,903 | B1 | 7/2004 | Morshed et al. |
| 6,816,828 | B1 | 11/2004 | Ikegami |
| 6,826,717 | B1 | 11/2004 | Draper et al. |
| 6,856,950 | B1 | 2/2005 | Abts et al. |
| 6,882,968 | B1 | 4/2005 | Linden |
| 7,133,820 | B2 | 11/2006 | Pennello et al. |
| 7,185,319 | B2 | 2/2007 | Kaler et al. |
| 7,899,661 | B2 | 3/2011 | Van Rompaey et al. |
| 8,521,499 | B1 | 8/2013 | Van Rompaey et al. |
| 8,543,367 | B1 | 9/2013 | Van Rompaey et al. |
| 2002/0032559 | A1 | 3/2002 | Hellestrand et al. |
| 2002/0174415 | A1 | 11/2002 | Hines |
| 2003/0188299 | A1 | 10/2003 | Broughton et al. |
| 2003/0217248 | A1 | 11/2003 | Nohl et al. |
| 2004/0010778 | A1 | 1/2004 | Kaler et al. |
| 2004/0068701 | A1 | 4/2004 | Chang et al. |
| 2004/0083088 | A1 | 4/2004 | Berent et al. |
| 2004/0102946 | A1 | 5/2004 | Shahabuddin et al. |
| 2004/0215438 | A1 | 10/2004 | Lumpkin et al. |
| 2005/0102640 | A1* | 5/2005 | Iwamoto ............... G06F 11/261 716/102 |
| 2005/0183066 | A1 | 8/2005 | Jabori |
| 2005/0209839 | A1 | 9/2005 | Nightingale et al. |
| 2005/0256694 | A1 | 11/2005 | Taylor |
| 2006/0069953 | A1 | 3/2006 | Lippett et al. |
| 2006/0195825 | A1 | 8/2006 | Vanspauwen et al. |
| 2006/0282233 | A1 | 12/2006 | Pasricha et al. |
| 2007/0162531 | A1 | 7/2007 | Kota |
| 2007/0168893 | A1 | 7/2007 | Watanabe et al. |
| 2007/0277130 | A1 | 11/2007 | Lavelle |

OTHER PUBLICATIONS

Mateos et al., "Hardware/Software Cosimulation Environment for CSoC with Soft Processors", IEEE 2004.

Guerra, et al., Cycle and Phase Accurate DSP Modeling and Integration for HW/SW Co-verification, IEEE, 1999.

Wieferink et al., "Retargetable Generation of TLM Bus Interfaces for MP-Soc Platforms", ACM 2005.

Wieferink et al., "A System Level Processor/Communication Co-exploration Methodology for Multi-Processor System-On-Chip Platforms", IEEE 2004.

Braun et al., "A Universal Technique for Fast and Flexible Instruction Set Architecture Simulation", IEEE 2004.

Mateos et al., "Hardware/Software Cosimulation Environment for CSoC with Soft Processors", IEEE in 2004.

Guerra et al., "Cycle and Phase Accurate DSP Modeling and Integration for HW/SW Co-Verification", ACM 1999.

Liu et al., "Software Timing Analysis Using HW/SW Cosimulation and Instruction Set Simulator", IEEE in 1998.

Software Timing Analysis Using HW/SW Cosimulation and Instruction Set Simulator, 6th International Workshop on Hardware/Software Co-Design, CODES/CASHE98, Seattle, Washington [USA], Mar. 15-18, 1998.

Bastien, B., "A Technique for Performing Fault Injection in System Level Simulators for Dependability Analysis", University of Virginia, 2004.

Coulaud et al., "Toward a Distributed Computational Steering Environment Based on Corba", Jan. 1, 1999, pp. 1-6.

Bagrodia et al., "Parsec: A Parallel Simulation Environment for Complex Systems", Oct. 1, 1998, pp. 77-85.

Cunha et al., "A Debugging Engine for a Parallel and Distributed Environment", Oct. 1, 1996, pp. 1-8.

Looney, Douglas, "Interactive Control of a Parallel Simulation Froma Remote Graphics Workstation", Dec. 14, 1993, whole document.

Magnusson et al., "Simics: a Full System Simulation Platform", Computer, Feb. 1, 2002, pp. 50-58.

Girod et al., "A System for Simulation, Emulation, and Deployment of Heterogeneous Sensor Networks", SenSys Nov. 3, 2004, pp. 1-13.

Herrod, Stephen, "Using Complete Machine Simulation to Understand Computer System Behavior", Feb. 1, 1998, whole document.

Bedichek, Robert. "Talisman: Fast and Accurate Multicomputer Simulation," Sigmetrics, Jan. 1, 1995, pp. 14-24.

Burger et al. "Accuracy vs. Performance in Parallel Simulation of Interconnection Networks," IEEE, Jan. 1, 1995, pp. 22-31.

Brewer et al. "Proteus: A High-Performance Parallel-Architecture Simulator," MIT Technical Report, Jan. 1, 1991, pp. 1-25.

Legedza et al. "Reducing Synchronization Overhead in Parallel Simulation", IEEE, Jan. 1, 1996, pp. 86-95.

Guthery, Scott B., "Self-Timing Programs and the Quantum Scheduler," Communications of the ACM, vol. 31, No. 6, Jun. 1988, pp. 696-703.

Prakash et al., "MPI-SIM: Using Parallel Simulation to Evaluate MPI Programs," Proceedings of the 1998 Winter Simulation Conference, Jan. 1, 1998, pp. 467-474.

Mukherjee et al., "Wisconsin Wind Tunnel II: A Fast and Portable Parallel Architecture Simulator," Workshop on Performance Analysis and Its Impact on Design, Jun. 1, 1997, pp. 1-10.

Bonaciu, M. et al., High-Level Architecture Exploration for MPEG4 Encoder with Custom Parameters, ASP-DAC '06: Proceedings of the 2006 Asia and South Pacific Design Automation, IEEE, Jan. 2006, pp. 372-377.

Wieferink, A. et al., "System Level Processor/Communication Co-Exploration Methodology for Multiprocessor System-On-Chip Platforms," IEEE Proc.-Comput. Digit. Tech, Jan. 2005, pp. 3-11, vol. 152, No. 1.

U.S. Appl. No. 13/038,152, filed Mar. 1, 2011, Inventors Karl Van Romaey et al.

United States Office Action, U.S. Appl. No. 13/038,152, Nov. 7, 2012, 13 pages.

U.S. Appl. No. 11/707,412, filed Feb. 16, 2007, Inventors Karl Van Rompaey et al.

United States Office Action, U.S. Appl. No. 11/707,413, Aug. 26, 2009, 14 pages.

United States Office Action, U.S. Appl. No. 11/707,412, Mar. 20, 2012, 73 pages.

United States Office Action, U.S. Appl. No. 11/707,412, Aug. 11, 2011, 72 pages.

United States Office Action, U.S. Appl. No. 11/707,412, Mar. 4, 2011, 72 pages.

United States Office Action, U.S. Appl. No. 11/707,412, Aug. 12, 2010, 79 pages.

United States Office Action, U.S. Appl. No. 11/707,412, Mar. 12, 2010, 22 pages.

United States Office Action, U.S. Appl. No. 11/707,412, Aug. 6, 2009, 19 pages.

* cited by examiner

400

| Address | Label | Instruction | comments |
|---|---|---|---|
| 0 | memcopy | mov r0, #3 | r0 = number of words to copy - 1 |
| 4 | | mov r1, srcAddress | r1 = source address |
| 8 | | mov r2, destAddress | r2 = destination address |
| 12 | copyoneword | load r3, [r1] | r3 = word at memory address r1 |
| 16 | | store r3, [r2] | write r3 to memory address r2 |
| 20 | | add r1, r1, #4 | source address = source address + 4 |
| 24 | | add r2, r2, #4 | destination address = destination address + 4 |
| 28 | | sub r0, r0, #1 | #words to copy = #words to copy - 1 |
| 32 | | cmp r0, #0 | #words to copy equal to zero ? |
| 36 | | BNZ copyone | if (#word to copy not equal to zero) then copy next word |
| 40 | | rts | return from subroutine |

| Address | Instruction | Instruction timing | Timing Events | Comments |
|---|---|---|---|---|
| 0 | mov r0, #4 | 7 | T, ILD | instruction cache load (8 instructions) |
| 4 | mov r1, srcAddress | 1 | T | instruction cache hit for next 8 instructions |
| 8 | mov r2, destAddress | 1 | T | |
| 12 | load r3, [r1] | 9 | T, DLD, DWB | data cache load and writeback (8 words) |
| 16 | store r3, [r2] | 10 | T, DLD | data cache load (8 words) |
| 20 | add r1, r1, #4 | 4 | T | |
| 24 | add r2, r2, #4 | 4 | T | |
| 28 | sub r0, r0, #1 | 1 | T | |
| 32 | cmp r0, #0 | 6 | T, ILD | memcopy is now in instruction cache |
| 36 | BNZ copyone | 8 | T, BMP | branch taken and mispredicted |
| 12 | load r3, [r1] | 3 | T | all source data in data cache |
| 16 | store r3, [r2] | 3 | T | all destination data in data cache |
| 20 | add r1, r1, #4 | 1 | T | |
| 24 | add r2, r2, #4 | 1 | T | |
| 28 | sub r0, r0, #1 | 1 | T | |
| 32 | cmp r0, #0 | 1 | T | |
| 36 | BNZ copyone | 1 | T | branch taken and predicted correctly |
| 12 | load r3, [r1] | 3 | T | |
| 16 | store r3, [r2] | 3 | T | |
| 20 | add r1, r1, #4 | 1 | T | |
| 24 | add r2, r2, #4 | 1 | T | |
| 28 | sub r0, r0, #1 | 1 | T | |
| 32 | cmp r0, #0 | 1 | T | |
| 36 | BNZ copyone | 1 | T | branch taken and predicted correctly |

465    470    475    480

Column 480 legend: T = instruction taken   DLD = data cache load (miss)   DWB = data cache writeback (miss + dirty)
ILD = instruction cache load (miss)   BMP = branch mispredict

Figure 4B

SIMULATION WITH DYNAMIC RUN-TIME ACCURACY ADJUSTMENT

CROSS REFERENCE TO RELATED APPLICATIONS

This application claims priority from U.S. patent application Ser. No. 11/707,412, titled "Simulation with Dynamic Run-Time Accuracy Adjustment," filed on Feb. 16, 2007, which itself claims priority from U.S. Provisional Application No. 60/774,947, titled "Virtual Embedded Software Performance Estimation," filed on Feb. 16, 2006. The subject matter of all of the foregoing is incorporated by reference in their entirety.

FIELD OF DISCLOSURE

Embodiments in accordance with the present invention relate to the field of simulation of computer instructions. More specifically, embodiments of the present invention pertain to simulation with dynamic run-time accuracy adjustment.

BACKGROUND

In recent years, embedded software performance analysis has been widely used to identify and improve software timing issues in embedded software. Examples of such timing issues include: slow response times during user interaction, e.g., it takes too long between a button activation and a responsive window opening; missed deadlines in real time software, e.g., a software driver that interacts with a hardware peripheral needs to read output data within a fixed time after writing the input data to prevent data loss, and unacceptably slow start up or "boot" time of an operating system.

Under the conventional art, software performance, e.g., embedded software performance, is typically measured on the target hardware, for example, at a point in a development cycle after the hardware has been designed, fabricated and is otherwise available. Although such performance measurements performed on the target hardware have a high degree of accuracy, such hardware based performance measurements suffer from several serious drawbacks.

A first drawback of hardware based performance measurement is that such a process can only be performed very late in a development cycle, e.g., after the hardware is available. As an unfortunate consequence, there is little time available to improve the software, and essentially no opportunity to modify the hardware, particularly integrated circuits.

Another drawback of hardware based performance measurement is that such a process generally is unable to provide visibility into the cause(s) of performance issues. Yet another drawback of hardware based performance measurement is that such processes generally require expensive and specialized laboratory equipment to perform the measurements. For example, such measurements may required high speed oscilloscopes, logic analyzers, in-circuit emulation (ICE) equipment and the like.

A still further drawback of hardware based performance measurement is that such a process is not generally accessible to a typical software developer. For example, hardware based performance measurements are typically performed by a team of highly trained individuals with specialized skills, e.g., including designers of the hardware. It is appreciated that typical target hardware is designed and optimized for a particular function, and many internal functions are deliberately hidden from end users, e.g., for ease of use and proprietary reasons, making performance testing and instrumentation difficult. Such a team including particular skill sets is generally required to set up tests and extract the results from hardware.

SUMMARY

Therefore, a need exists for systems and methods for simulation with dynamic run-time accuracy adjustment(s). A need also exists for systems and methods for simulation performed early in a design process that also satisfies the above need. A further need exists for systems and methods for simulation with dynamic run-time accuracy adjustment that are compatible and complementary with existing systems and methods of software simulation. Embodiments in accordance with the present invention provide for these needs.

Embodiments in accordance with the present invention automatically and dynamically switch between high speed simulation methods with lower performance accuracy, and lower speed simulation methods with higher performance accuracy. Such mode switching is available at run-time, in one embodiment. By dynamically blending multiple simulation methods, a simulation with sufficient accuracy is obtained much faster than under the conventional art.

Accordingly, systems and methods for simulation with dynamic run-time accuracy adjustment are disclosed. In one embodiment, a first portion of a sequence of software instruction is simulated by a first simulation model, during a simulation. During the same simulation, a second portion of the sequence is simulated by a second simulation model. State information may be transferred from the first simulation model to the second simulation model. A change from simulating the first portion of a sequence of software instructions by the first simulation model to simulating the second portion of the sequence by the second simulation model may be made responsive to a computer-based determination of an advantage obtained by the change.

In accordance with another embodiment of the present invention, a software simulation system includes a plurality of processor simulation models and a controller capable of running any of the plurality of processor simulation models in any sequence and operable to perform dynamic run-time simulation model switching between the plurality of processor simulation models.

In accordance with an alternative embodiment of the present invention, a system for simulating software operating on a computer system includes a processor component for simulating a processor of the computer system, the processor component comprising first and second simulation models for simulating the processor and a memory subsystem component for simulating a memory of the computer system. The system also includes a bus component for simulating interconnection between the processor and the memory, wherein the bus component couples the processor component to the memory subsystem component and debugger software for providing user interaction with the processor component, wherein the processor component further comprises a controller for controlling which of the first and second simulation models is running at any given time and for switching, at run time, between the simulation models.

In accordance with yet another embodiment of the present invention, a software simulation system includes a component for simulating a subsystem of a computer system wherein the component comprises a plurality of simulation models and wherein further each of the plurality of simulation models is operable for simulating the subsystem in a different manner and a controller for controlling at run time which one of the plurality of simulation models is running at any given time.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not to scale.

FIG. 4A illustrates an exemplary instruction sequence, in accordance with embodiments of the present invention.

FIG. 4B illustrates an exemplary timing cache data structure, in accordance with embodiments of the present invention.

DETAILED DESCRIPTION

Figure 1:
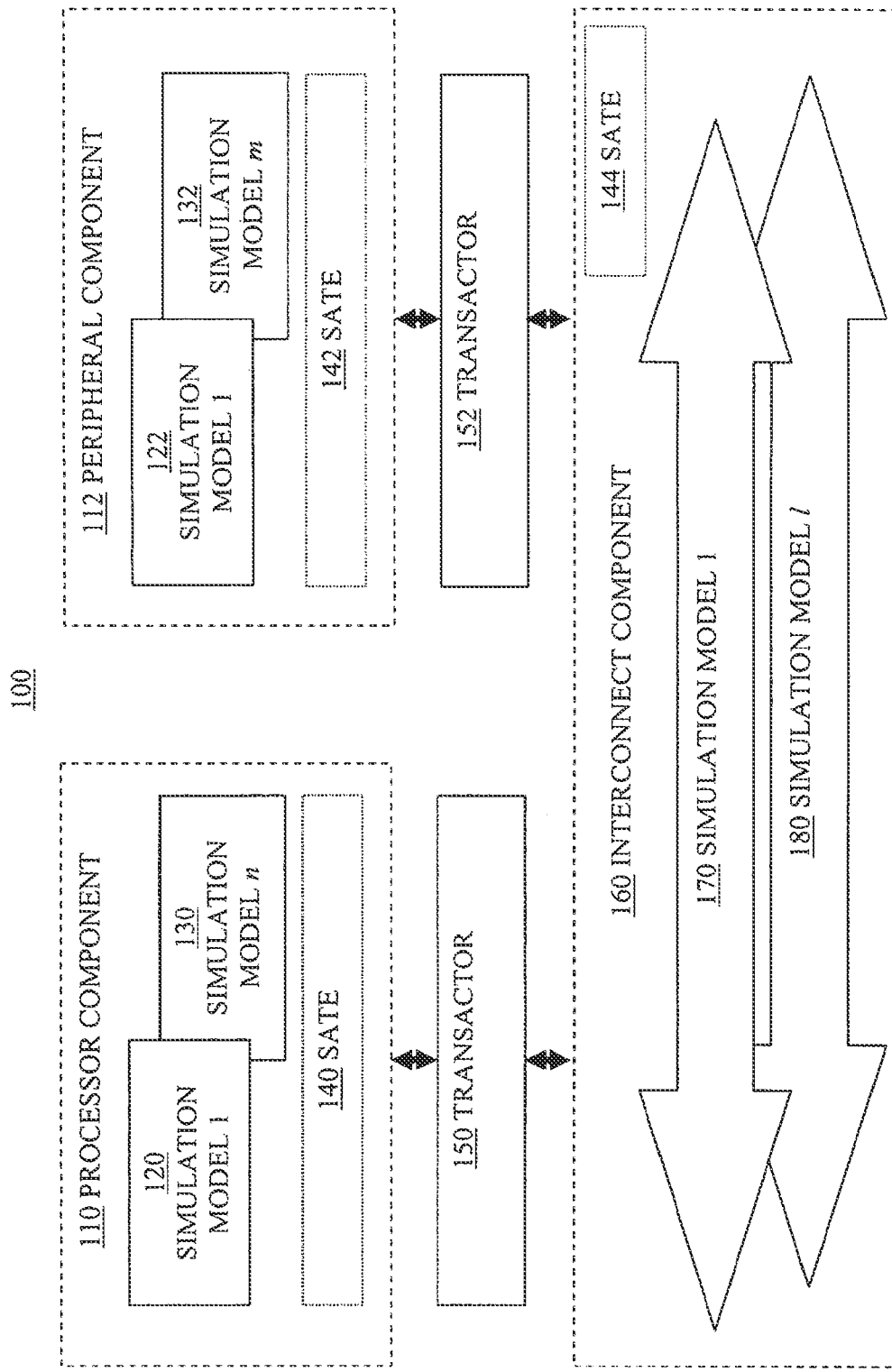
FIG. 1 illustrates an exemplary block diagram of a virtual simulation platform with dynamic run-time accuracy adjustment, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions that follow (e.g., processes 200 and 600) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Simulation with Dynamic Run-Time Accuracy Adjustment

Existing systems of simulation generally are either too slow to be of value in performance measurement, or do not provide sufficient accuracy to correctly predict performance. For example, very accurate simulation platforms can be built from cycle accurate models of processor(s), interconnections, memories, peripheral devices and the like, and achieve speeds on the order of 100+ thousand simulated clock cycles per second. Unfortunately, over the last few years, software complexity has increased to a level at which simulation of merely booting an operating system can take on the order of a billion instruction executions. For example, at one simulated instruction per simulated clock cycle, the exemplary billion instructions would take several hours to simulate. Consequently, this type of platform is unsatisfactorily slow for many performance simulation environments.

In contrast, instruction accurate modeling may produce software emulation at much greater speed. However, the results of such instruction accurate modeling are generally not accurate enough for many performance measurements.

Embodiments in accordance with the present invention rest on several observations and determinations presented below. Embedded software is typically very repetitive, e.g., such software comprises numerous loops and other repetitively executed structures. Typically, the execution of about ten percent of the instructions represents about 90 percent of the execution time of software. This property can be used to improve simulation speed of a virtual platform, but makes it harder to achieve the required accuracy. The accuracy error for the most frequently executed instructions will approximately be the same as the accuracy error for the whole software application.

The majority of software performance analysis use cases, e.g., scenarios being evaluated, do not require 100% cycle accuracy. For example, high level language, e.g., C, C++ or Java, compilers provide at most a few software optimization options, but generally do not provide any guarantee of the actual performance that will be achieved. Software is typically developed with a significant safety margin when it comes to performance. Furthermore, software performance is typically measured in milliseconds or seconds and not clock cycles. For example the time between a button activation and opening a user interface on-screen window is measured on the order of several hundred milliseconds. Any faster duration will not be observable. For example, an error of 20 milliseconds on a run of 100 milliseconds to open a window is not observable to a user; hence, in general it may be assumed that greater than about 80 percent accuracy is sufficient for the majority of the software use cases. This relaxation of the required accuracy can be used to further optimize simulation speed and modeling effort. Furthermore, some architectural aspects do not need to be modeled.

Software performance analysis is frequently not performed on a full application run. Rather, such analysis is usually performed on very specific portions of the software for which performance is critical. A typical instance relates to device drivers, which need to interact in a timely fashion with hardware peripherals. Another type of software for which performance is generally critical are those portions of software that relate to user responsiveness, such as the time between a button activation and opening a user interface window. A third type of software for which performance is generally critical is real time software, for example digital signal processing (DSP) software that needs to achieve a required sampling frequency.

The number of instructions executed during a performance measurement is known as, or referred to as, the "instruction window" (IW). Typically the instruction window for device drivers (order of 0.1 ms) is much less than an instruction window for real-time software (order of 10 ms) is much less than an instruction window for user interface responsiveness (order of 100 ms). This generalization leads to a conclusion that accuracy is typically only measured on small portions of an application run. For example, the operating system needs to be initialized (e.g., booting Linux takes about one billion instructions) before an actual application starts to run and actual measurements of that application can be made. Hence, it is very valuable to simulate as fast as possible, e.g., with reduced or no accuracy requirements, to a point at which performance measurements are required. At a point at which performance measurements are required, a more accurate simulation is required. This variable requirement for simulation accuracy enables embodiments in accordance with the present invention to advantageously trade speed for accuracy.

Vendors of processor intellectual property (IP) generally create and provide to their customers, e.g., integrated circuit designers, both cycle accurate and instruction accurate processor models. Similarly, other hardware IP vendors usually provide cycle accurate models and functional models, which serve a similar function to a processor's instruction accurate model. Design teams generally use the instruction/function accurate models, which execute relatively fast, to verify the functional correctness of the embedded software. The cycle accurate models, which generally execute much more slowly, are used to verify detailed hardware interaction of the processor with the rest of the hardware. Leveraging these existing types of models to enable embedded software performance analysis would advantageously eliminate processor IP confidentiality and validation issues.

Embodiments in accordance with the present invention use such cycle accurate and instruction/functional accurate models, or any other models available from an IP vendor, or otherwise, to construct a virtual platform for simulation with dynamic run-time accuracy adjustment. For example, the virtual simulation platform may be configured, e.g., at compilation and/or simulation time, for high simulation speed or for high accuracy, or for a combination of both characteristics. As a beneficial result, the same platform model may be used for different use models. For example, the virtual simulation platform may be used for functional software verification, e.g., using only instruction/functional accurate models. Alternatively, the same virtual simulation platform can be used for hardware verification and integration, e.g., using only cycle accurate models.

In addition, the virtual simulation platform may be used for software performance analysis and architecture exploration, e.g., utilizing a combination of "fast" instruction/functional accurate models and "slow" cycle accurate models. In accordance with embodiments of the present invention, the virtual simulation platform may dynamically and automatically simulate instruction execution with an optimized combination of cycle accurate and/or instruction/functional accurate models to maximize a speed of simulation with a minimal loss in accuracy. The cycle accurate models may provide timing information that is then re-used during instruction accurate/functional simulation.

FIG. 1 illustrates an exemplary block diagram of a virtual simulation platform 100 with dynamic run-time accuracy adjustment, in accordance with embodiments of the present invention. Simulation platform 100 comprises a plurality of components, e.g., processor component 110, peripheral component 112 and interconnect component 160. The plurality of components describe a system to be simulated. For example, processor component 110 describes a processor of the system. Likewise, peripheral component 112 describes a peripheral subsystem, e.g., memory or an input/output device, of the system. Interconnect component 160 describes the interconnection of the other components, e.g., a memory map and/or bus architecture. It is appreciated that embodiments in accordance with the present invention are well suited to the simulation of greater numbers and other types of components than illustrated.

Each of the plurality of components comprises a plurality of simulation models. For example, processor component 110 comprises simulation models 1 (120) through simulation model n (130). Likewise, peripheral component 112 comprises simulation models 1 (122) through simulation model m (132). Similarly, interconnect component 160 comprises simulation models 1 (170) through simulation model l (180). The simulation models within a component provide for a variety of methods of simulating the behavior of that component. For example, one simulation model for a processor may provide for cycle accurate simulation, while another model for that same processor may provide for instruction accurate simulation. It is appreciated that embodiments in accordance with the present invention are well suited to a variety of simulation methods, and are not limited to those exemplary methods described herein. Further, although the number and types of simulation models may generally be the same for all components, this is not required. The simulation models may be known models, e.g., provided by the component and/or IP vendor, or otherwise available for use.

Each of the plurality of processor and/or peripheral components is coupled to an interconnect component via a transactor, e.g., transactors 150 and 152. Generally, an interconnect component moves transactions, e.g., events, from one subsystem simulation to another. For example, a processor simulation may initiate an instruction fetch from a memory simulation. The interconnect component transfers the fetch request from the processor simulation to the memory simulation, and returns the result from the memory simulation to the processor simulation.

In accordance with embodiments of the present invention, however, two components may be running different types of simulations. For example, a processor component may be running a cycle accurate simulation, while a memory component may be running a functional simulation. The transactors translate such transactions between the differing domains of simulation, e.g., between timed simulation(s) and un-timed simulation(s).

In accordance with embodiments of the present invention, each of the plurality of components of simulation platform 100 further comprise a Speed and Accuracy Trade-off Engine (SATE), for example SATEs 140, 142 and 144. Each SATE has a control input, through which a desired mode of operation may be selected. For example, responsive to the control input, a SATE may select a particular simulation model, e.g., cycle accurate or instruction/function accurate, from among the plurality of available simulation models within its component. In one embodiment, the control inputs of all SATEs may be tied together such that the same types of simulation models are being used by all components. However, this is not required in all cases, as it may be desirable to use a mixture of simulation models at any given point in time. It is appreciated that the mode of operation may be user specified or may be set automatically upon the occurrence of particular events.

In accordance with embodiments of the present invention, a speed and accuracy trade-off engine may run an entire simulation using a particular simulation model, e.g., a cycle accurate model. In addition, a SATE is capable of dynamically selecting from among all available simulation models during a system simulation. For example, an operating system initialization can be simulated in a "fast" instruction accurate mode, and at a point in the simulation at which a digital signal processing software is to operate, the simulation can be switched to a "slow but accurate" cycle accurate simulation.

In accordance with embodiments of the present invention, each simulation model implements an interface that allows the SATE to transfer the simulated state between simulation models. For example, a cycle accurate simulation model will generally have much more state information than an instruction accurate simulation model. The SATE converts the different state representations.

Figure 2:
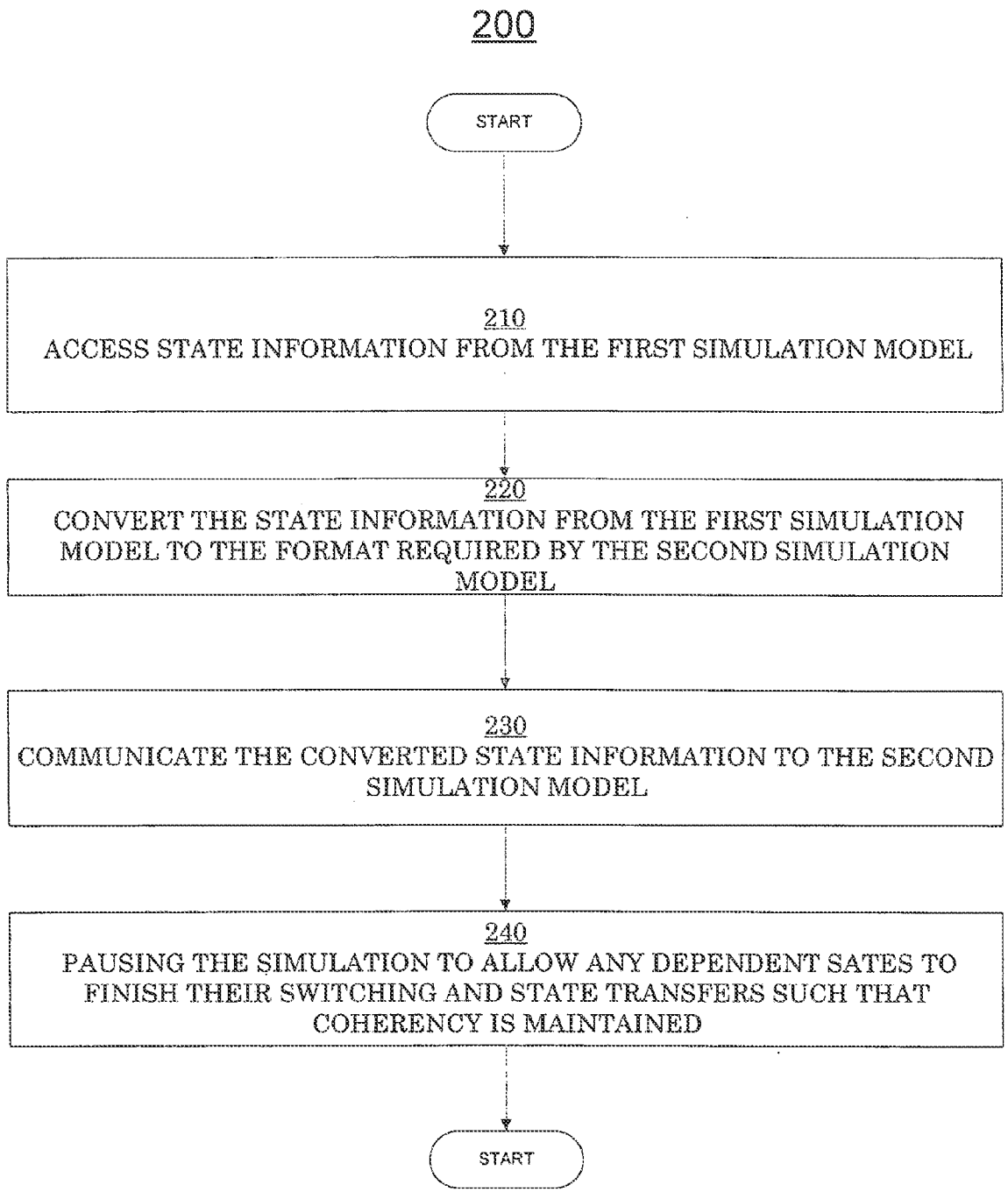
FIG. 2 illustrates an exemplary computer controlled method of transferring state information from a first simulation model to a second simulation model, in accordance with embodiments of the present invention.

FIG. 2 illustrates an exemplary computer-implemented method 200 of transferring state information from a first simulation model to a second simulation model, in accordance with embodiments of the present invention. Process 200 is described in the context of state switching. In 210, the state information from the first simulation model is accessed. For example, all of the state variables available from the first simulation model may be accessed, e.g., via an applications programming interface (API) for reading state information. Alternatively, only relevant state variables may be accessed. In some cases it is possible to determine whether a state variable will be used by the second simulation model. If a particular state variable will not be used, it is beneficial not to access it from the first simulation engine.

In accordance with another embodiment of the present invention, state changes may be tracked outside of a simulation engine, e.g., by a SATE. This technique enables a differential update, e.g., only those states that have changed need to be accessed and transferred. It is to be appreciated that compression techniques may be applied to such an external dataset of state information.

In accordance with still another embodiment of the present invention, the first simulation model can be run with a known set of input stimuli to bring the simulation model into a known condition with a small set of state information that can be readily accessed. For example, a cache may be cleaned and then invalidated (flushed). In accordance with yet another embodiment of the present invention, the plurality of simulation models may be implemented such that they share state variables in common, making changes in state directly visible to all such simulation models. It is to be appreciated that combinations of the above described embodiments are also well suited to embodiments in accordance with the present invention.

In 220, the state information from the first simulation model is converted to the format required by the second simulation model. In 230, the converted state information is communicated to the second simulation model. In some embodiments in accordance with the present invention, state information may be communicated to the second simulation model via an applications programming interface (API) for writing state information.

In accordance with another embodiment of the present invention, the second simulation model can be run with a known set of input stimuli to bring the simulation model into the desired state. In accordance with yet another embodiment of the present invention, if the first and second simulation models are implemented such that they share state variables in common, the state change may be automatically communicated to the second simulation model. It is to be appreciated that combinations of the above described embodiments are also well suited to embodiments in accordance with the present invention.

In 240, the system simulation is paused to allow any dependent SATEs to finish their switching and state transfers such that coherency is maintained. To maintain coherency of the system simulation, each SATE should wait for its dependent SATEs to finish switching. For example, the SATE of a processor component, e.g., SATE 140 of FIG. 1, has a dependency from the SATE of an interconnect component, e.g., SATE 144 of FIG. 1, to prevent the processor component from sending transactions to the interconnect component before the interconnect component has completed switching and can simulate transactions.

Different simulation models may also use different interfaces to communicate data. To resolve this incompatibility, every port of a component is connected via a transactor, e.g., transactor 150 of FIG. 1, with the rest of the system. Transactors, when required, convert data communicated between simulation models.

It is appreciated that the above embodiments may also be utilized when multiple simulation models are implemented from the same or different source files and/or embedded into a single simulation executable or library. This type of simulation model externally should appear as a single simulation model, although, internally the SATE provides an ability to switch among simulation models.

In general, a state update may be required during simulation when multiple models of the same resources, e.g., entire processors, caches, memory management units, etc., are contained in a simulation executable. If such resources comprise state information, a dynamic switch between these resource models may be requested at some point in the future.

In a case of relatively simple resources, e.g., memories, this effort may not be necessary. For example, a state could be represented by a single simulation model, which contains an optional timing calculation extension. Depending on the requested accuracy, this extensions may be used, or it may not be used. In many situations this approach may provide satisfactory simulation accuracy.

However, due to legal, e.g., IP licensing, or technical reasons, functionality and timing calculation often cannot be separated. In this case, a dynamic trade-off between simulation speed and cycle count accuracy can most likely only be obtained by integrating two models of the same functionality, including state information, into the same platform simulator. Then actions for synchronizing the state between these models are necessary.

It is appreciated that in any simulation, correct functionality should be maintained, independent of desired accuracy and which simulation model(s) are utilized. In many cases, however, a tradeoff between state update effort and cycle count accuracy is possible.

Many resources, e.g. caches, memory management units (MMU) and/or translation lookaside buffers (TLB), contain varying amounts of state information, which are generally marked as to their status, e.g., by valid-flags and the like. A full state update implies restoring all valid state information at the target side. It may, however, be sufficient to completely tag such target resource as currently invalid. It is appreciated that on the source side the respective resources should be synchronized with the background memory, e.g., cache lines need to be cleaned.

Subsequently, as simulation continues on the target side, missing cache lines are loaded into the cache. Correct functionality is ensured; however, cycle count accuracy is impacted since the additional cache line or MMU-TLB loads directly increase cycle counts when they occur. In addition, the new content may be loaded into different locations, e.g. cache ways, than they where there were initially located. This generally leads to different cache contents and thus a different hit/miss distribution in the future.

It is appreciated that such simplifications may sometimes contribute to a cycle count error immediately after a switch. However, this error converges to zero the longer simulation continues on this processor.

In accordance with embodiments of the present invention, the level of update required may be expressed as an "update level." In an embedded processor, for example ARM1136, the following update levels as illustrated in Table 1 below, may be used. The higher the update level, the more resources are updated.

TABLE 1

1) update just the processor core, e.g., registers
2) update the MMU-main TLBs as well
3) update the level-1 instruction cache as well
4) update the level-1 data cache as well
5) tag dirty lines in the data cache as dirty again.
6) update branch predictor state as well
7) update MMU - micro TLBs as well.
. . .
10) update all state information There is often an inverse relation between the amount of internal state of a resource and the frequency at such state changes. For example, resources such as processor registers have a limited amount of state, but the contents change very often. For such resources, a full state update may be considered reasonable, and generally all register contents should be copied one for one from a source model to a target model.

In contrast, resources such as caches contain large amounts of state, e.g., on the order of many kilobytes, but such contents do not change at a high rate. If many switches between simulation models are necessary, only a few cache lines may actually have changed between the last switch and when a next switch is requested. The overhead to copy over the full cache contents on each such switch would be deleterious. Furthermore, many third party simulators may not provide direct access to the cache contents in their simulation models; in such cases a full state transfer on demand is generally not even be possible.

In accordance with embodiments of the present invention, a differential state update is available, e.g., for resources that are not directly accessible via the simulation model or for which a full copy operation would otherwise be onerous. Events that change state, e.g., cache read misses, cache writebacks, MMU-TLB-loads and the like, are traced and stored in a history container. On a switch, this history is replayed into the target simulator. This way, a target state is build up in a stepwise fashion.

Many third party target models may have limitations in pushing in, or loading state information. For example, the target simulation model may not allow an entire cache to be written. A cache line load replay may only be triggered by the virtual address to load. This means that the MMU memory mapping needs to be the same as it was when the load occurred. Replaying all MMU reloads and cache reloads in chronological order ensures this by nature. It is appreciated that that very frequent items like cache read hits, TLB-hits and the like generally do not need to be traced since such actions do not alter the cache or TLB state.

The state update mechanism may comprise two predominate use models. In a first use model, if state switches are invoked only by manual intervention, it is likely that a relatively few switches will be requested. Such a rate may be a few switches per wallclock minute or even hour. A second use model is based on automatic state switching under the control of a Speed-Accuracy-Tradeoff-Engine (SATE). In this model, hundreds or even thousands of switches may be triggered per second, based on certain events.

The above-described history based state update mechanism is targeted for both use cases. The second use model is supported due to the differential approach. Many switches imply not too many instructions being executed on the platform until the next switch, so only a small subset of cachelines/TLB entries is likely to be replaced.

As described thus far, the first use model may seem inefficient for a straight forward history based approach. For example, long simulation runs without a switch imply that each cacheline will even be replaced many times. So replaying a cache line load, for example, is only worthwhile when it is still in the cache at the end of the switch.

However, in accordance with embodiments of the present invention, the history store or container may be effectively compressed. For example, whenever the history container gets a cache line refill reported that refers to a cache index that has already been filled before in the history, the earlier entry can be deleted. Alternatively, if a cache line is written to, this only needs to be notified the first time. No subsequent writes to this line need be accounted for. If the same cache line is evicted, even the first write event (as the cache load itself) is deleted. As another example, if the operating system running on the simulated processor invokes a context switch, the operation system software will most likely explicitly invalidate many MMU/TLB entries for the mapping that becomes invalid. In the history, these invalidations can trigger deletion of TLB loads for the same addresses earlier in the history. However, these load-invalidate pairs can only be deleted if the mapping is also not needed any more for loading cache lines that are relevant for the final cache contents.

A history compression should ensure that the differential update is never more expensive than a full update. In this manner, the same history based approach is applicable for both use cases described above.

Figure 3:
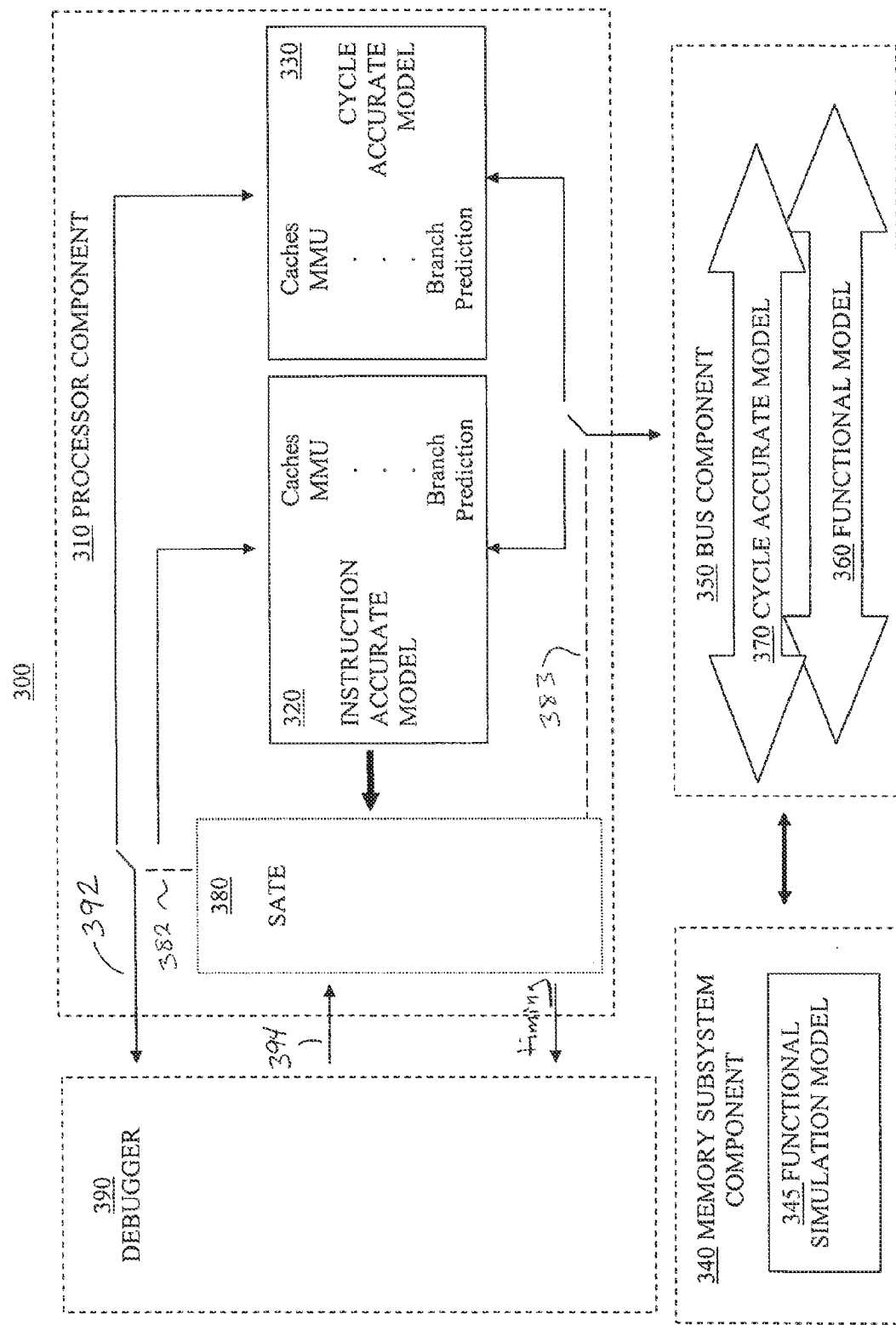
FIG. 3 illustrates an exemplary simulation system, in accordance with embodiments of the present invention.

FIG. 3 illustrates an exemplary simulation system 300, in accordance with embodiments of the present invention. Simulation system 300 comprises a processor component 310, similar to processor component 110 of FIG. 1. Processor component 310 comprises an instruction accurate simulation model 320 and a cycle accurate simulation model 330. Both instruction accurate simulation model 320 and cycle accurate simulation model 330 comprise models for a plurality of processor subsystems, e.g., caches, memory management units (MMUs), branch prediction and the like.

Simulation system 300 also comprises a memory subsystem component 340. Memory subsystem component 340 comprises a functional simulation model 345. It is appreciated that memory subsystem component 340 may comprise other memory simulation models, e.g., a cycle accurate model or a timing calculation extension.

In addition to the elements previously mentioned, simulation system 300 comprises a bus component 350, similar to interconnect component 160 of FIG. 1. Bus component 350 comprises an instruction accurate simulation model 360 and a cycle accurate simulation model 370. Transactors between the processor component 310 and the bus component 350, as well as between the memory subsystem component 340 and the bus component 350 as described in FIG. 1 are omitted herein for clarity.

Processor component 310 further comprises a Speed and Accuracy Trade-off Engine (SATE) 380. As previously described with respect to FIG. 1, a SATE enables a component, e.g., processor component 310, to operate a plurality of different types of simulation models, e.g., instruction accurate simulation model 320 or cycle accurate simulation model 330. SATE 380 controls inputs and outputs of processor component 310 via controls 382 and 383, so as to produce a consistent interface to other components of simulation system 300. For example, bus component 350 interacts with processor component 310 in a consistent manner, independent of which simulation model, e.g., instruction accurate simulation model 320 or cycle accurate simulation model 330, is operating within processor component 310.

Simulation system 300 further comprises a debugger 390. Debugger 390 enables user interaction with the simulation, for example, starting and stopping simulation, setting breakpoints, obtaining timing information and the like. Such conventional debugging commands and results are coupled with processor component 310 via debugger interface 392. It is appreciated that debugger interface 392 may be directed to the presently operating simulation engine, e.g., instruction accurate simulation model 320 or cycle accurate simulation model 330, within processor component 310 under control of SATE 380. Thus, neither debugger 390 nor a user/operator of debugger 390 need be aware of the details of which simulation model, e.g., instruction accurate simulation model 320 or cycle accurate simulation model 330, is presently operating within processor component 310.

In accordance with embodiments of the present invention, debugger 390 comprises a unique "accuracy on demand" interface 394 with processor component 310. More particularly, "accuracy on demand" interface 394 is a control input to Speed and Accuracy Trade-off Engine (SATE) 380 of processor component 310. "Accuracy on demand" interface 394 is capable of commanding SATE 380 into one of at least three simulation modes: a "fast" mode, and "accurate" mode and an "approximate" mode.

In "fast" mode, Speed and Accuracy Trade-off Engine (SATE) 380 controls processor component 310 such that substantially all of the simulation is performed by instruction accurate simulation model 320. As previously described, instruction accurate simulation model 320 models processor execution at an instruction level. It is generally the fastest mode of simulation. However, the speed of simulation is achieved at a loss of simulation accuracy.

In "accurate" mode, Speed and Accuracy Trade-off Engine (SATE) 380 controls processor component 310 such that substantially all of the simulation is performed by cycle accurate simulation model 330. As previously described, cycle accurate simulation model 330 models processor execution at a clock cycle level. It is generally the most accurate mode of simulation. However, the accuracy of simulation sacrifices simulation speed.

Speed and Accuracy Trade-off Engine (SATE) 380 is further capable of operating processor component 310 in a novel third mode, known as "approximate" mode. In "approximate" mode, the SATE may dynamically and automatically determine which of the available processor simulation models to use. For example, in "approximate" mode, the SATE selects between simulating with instruction accurate simulation model 320 or cycle accurate simulation model 330. It is to be appreciated that the selection from among available simulation models is not static, and that a portion of a simulation may be performed by a first model, and another portion of the simulation may be performed by a second model. Furthermore, the simulation may be dynamically switched from model to model any number of times in any sequence.

It is to be appreciated that a user, e.g., via debugger 390, can change the setting of the "accuracy on demand" control input 394 at any time during the simulation. As previously described with respect to FIG. 1, the SATEs within the various components of simulation system 300 determine which simulation models of each component are used. For example, during operation of cycle accurate model 330 of processor component 310, the cycle accurate model 370 of bus component 350 will generally be utilized. During operation of instruction accurate model 320 of processor component 310, the functional model 360 of bus component 350 will generally be utilized. A functional model of a memory subsystem, e.g., function simulation model 345 or memory subsystem component 340, is generally utilized for speed considerations.

It is appreciated, however, that more accurate models of memory, e.g., a cycle-accurate memory model, may be utilized as well.

Approximate mode may be utilized to obtain a desirable combination of the characteristics of the available simulation models. For example, by utilizing approximate mode, a simulation may be performed with greater accuracy than is available from an instruction-accurate simulation (which may generally be characterized as fast but inaccurate) at a greater speed than is available from a cycle-accurate simulation (which may generally be characterized as accurate but slow). The novel approximate mode may be characterized as fast and accurate.

While operating in approximate mode, the Speed and Accuracy Trade-off Engine (SATE), e.g., SATE 380, automatically determines which of the available simulation models to utilize at any given time in the overall operation of simulation system 300. In accordance with embodiments of the present invention, an accurate simulation model, e.g., cycle accurate model 330, is used to collect accurate instruction timing, and a fast simulation model, e.g., instruction accurate model 320, is used to simulate instruction functionality. Accurate timing information collected during accurate simulation, e.g., cycle accurate model 330, is applied as an estimate of timing during fast simulation, e.g., instruction accurate model 320.

For example, during a first simulated pass through a software loop, e.g., drawing a graphical user interface, the loop is accurately simulated e.g., via cycle accurate model 330. The accurate timing for the loop is collected and recorded by SATE 380. On a subsequent pass through the same software, the loop is simulated via a fast simulation model, e.g., via instruction accurate model 320. The timing information generated by the accurate simulation model and collected during the first pass is used as timing information for the subsequent pass. It is appreciated that the timing information, in general, will be highly correlated between two passes of the same software loop. For additional passes through this loop, fast simulation may be used with attribution of the previously collected accurate timing. In this novel manner, the overall simulation of multiple passes through this loop approaches the simulation speed of the fast simulation model, and the timing accuracy is similar to that of the accurate simulation model.

It is to be appreciated that embodiments in accordance with the present invention are well suited to a wide variety of strategies for determining which of the available simulation models to utilize at any given time. For example, statistical information about a number of times a particular portion of software executes may help determine which simulation model(s) to utilize. Alternatively, the criticality of a particular portion of software, e.g., a digital signal processing routine, may help determine which simulation model(s) to utilize. In addition, timing information that is not directly related to instructions, e.g., timing for a cache miss, branch misprediction, and/or memory management unit translation lookaside buffer(s) and the like, may be inserted into a fast simulation, e.g., a simulation via instruction accurate model 320, to account for such events without having to actually perform a timing accurate simulaton of such events.

In accordance with embodiments of the present invention, accurate timing information, e.g., as obtained during a cycle accurate simulation, may be stored in a timing cache data structure. The presence or absence of timing information in such a data structure may be used in determining which of the available simulation models to utilize at any given time. For simple processors, e.g., processors with a single pipeline or multiple dependent pipelines, the "Timing Cache" architecture may comprise a lookup table indexed by the instruction address, and/or the instruction type (opcode), and an "Instruction Timing Event."

The term "Instruction Timing Event" is used to refer to, or to describe, any processor or platform related information that influences the timing of the executed instruction. For example: in a case of a load/store instruction, the memory access latency, data cache hit/miss, MMU TLB hit/miss can be important, in case of a branch instruction the correct or incorrect prediction of a branch is important, etc. The events that may be instruction timing events are very processor and memory subsystem specific. In general cache hit/miss, memory latency and branch prediction are the most important events to implement. The term "instruction timing" is used to refer to, or to describe, the time required until a next instruction can start execution. It is appreciated that some processor models allow for out of order instruction completion, e.g., interleaved execution in one or more pipelines. In such cases, the time until a next instruction can start may be much less than a time required for a previous instruction to complete.

FIG. 4A illustrates an exemplary instruction sequence 400, in accordance with embodiments of the present invention. Instruction sequence 400 implements a small looping routine to copy a number of words from one location in memory to another. Instruction sequence 400 will be used to illustrate embodiments of a timing cache, described below.

FIG. 4B illustrates an exemplary timing cache data structure 460, in accordance with embodiments of the present invention. Timing cache 460 comprises three columns. Column 465 comprises an instruction address for which timing information is to be, or has been, collected. Column 470 comprises the instruction corresponding to the address on the same row from column 470. Column 475 comprises the timing information, e.g., a number of clock cycles, for the execution of the instruction.

In accordance with an exemplary embodiment of the present invention, the timing information in column 475 is collected during an accurate simulation, e.g., utilizing cycle accurate simulation model 330 of FIG. 3. For example, the first instruction of instruction sequence 400 (FIG. 4A) (at address 0) requires seven clock cycles to execute. These seven cycles may include an instruction cache load for a miss, as the instruction sequence 400 (FIG. 4A) is not present in the instruction cache on its first execution.

Instructions at addresses 4 and 8 take only one cycle, as indicated. The instruction at address 12 takes nine cycles. This may include a data cache load for a miss, and a data cache write back, as the cache line was dirty. Instructions at addresses 20, 24 and 28 take the indicated number of cycles. The instruction at address 32 takes 6 cycles, including an instruction cache load on a miss.

The instruction at address 36 is a branch instruction. As indicated, it takes eight cycles to complete, including a branch misprediction. The branch is actually taken, and program flow continues at address 12.

In accordance with embodiments of the present invention, the timing information for the instruction at address 12 is already present in timing cache 460, having been collected on the first execution of that instruction. Consequently, it is not necessary to perform a timing-accurate simulation, e.g., a cycle accurate simulation, for this (and some number of following instructions). Rather, they may be functionally simulated, e.g., via instruction accurate simulation model 320 of FIG. 3, at greater speed of simulation, and the timing values from timing cache 460 supplied in substitution for actual simulated values.

It is to be appreciated that some loss of accuracy may occur with the above described method. For example, on a second pass through the loop of instructions at addresses 12 through 36, the instructions should be in an instruction cache, and the data should be in a data cache. In addition, the branch of the instruction at address 36 may be predicted correctly. Thus, the actual time to execute the loop on second and subsequent passes may be less than was measured for the execution of the first pass through the loop.

In accordance with embodiments of the present invention, such timing errors may be acceptable. For example, much performance analysis is directed to determining worse case behavior, e.g., the signal processing routine must be at least so fast to process the signal. Alternatively, is the graphical user interface updated fast enough to meet usability goals.

It is appreciated that additional columns, e.g., column 480 may optionally be added to timing cache 460, to identify particular timing events that may be associated with an instruction. For example, the timing of the first execution of the instruction at address 12 included a data cache load and writeback. The second execution of the instruction at address 12 does not include those events. By associating such events with the instruction and its timing information, embodiments in accordance with the present invention may determine that timing for the second execution of the instruction at address 12, e.g., without a data cache load and writeback, is not present in the timing cache. Thus, simulation may not be switched from, e.g., a cycle accurate simulation model to an instruction accurate model.

It is appreciated that a third and subsequent passes through the loop have the same timing as the second pass through the loop. Thus, collecting accurate timing information for a second pass through the loop provides very accurate timing for subsequent passes, even if a less accurate simulation, e.g., instruction accurate simulation, is used to simulate the latter passes.

In accordance with another embodiment of the present invention, the time required for timing events such as cache loads, branch mispredictions and the like may be identified, and subtracted from or added to timing values stored in a timing cache, based upon information provided by a less accurate simulation, e.g., an instruction accurate simulation.

However, for more complex processors, e.g., processors with multiple and independent pipelines, a more sophisticated architecture is required. In such a case, the timing of an instruction is not only a function of its instruction timing events; rather an instruction's timing is also influenced by its neighboring instructions. In this case, and in accordance with embodiments of the present instruction, each entry in a timing cache or the complete timing cache can be implemented as a graph.

Figure 5:
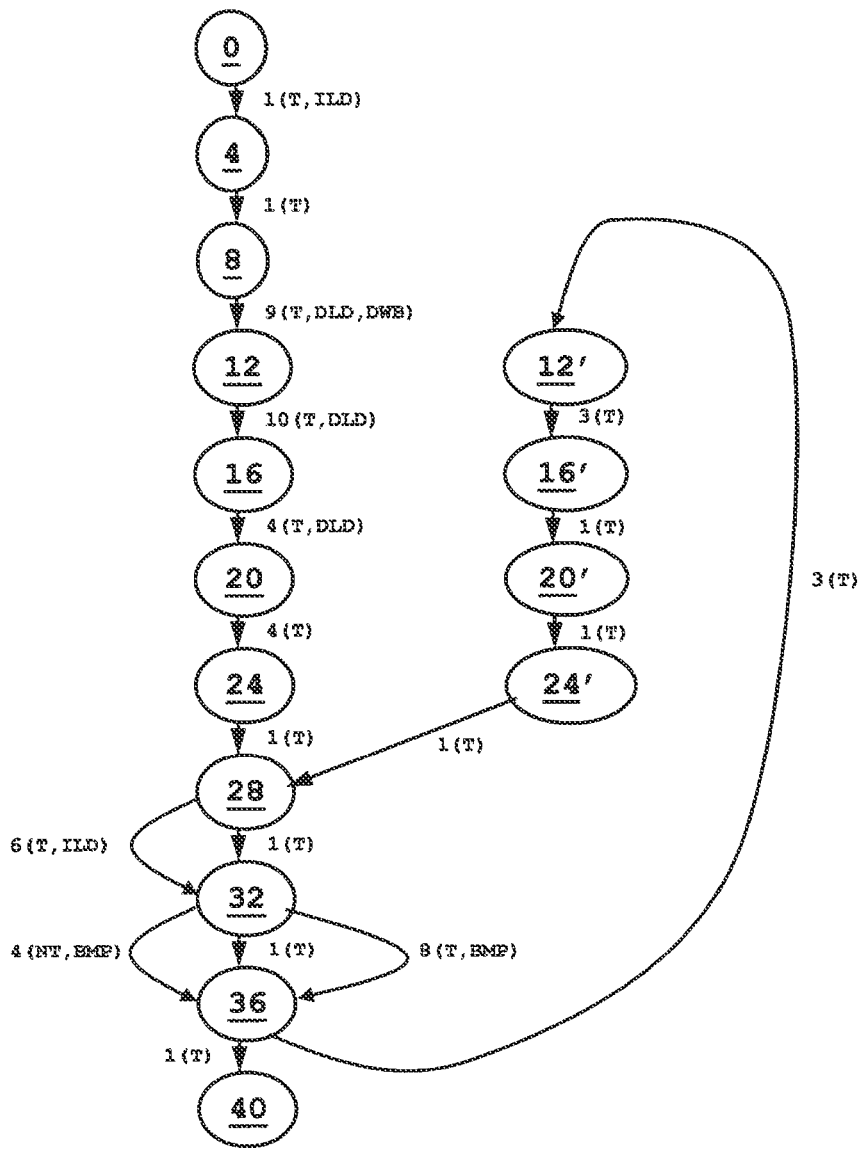
FIG. 5 illustrates an instruction timing cache graph, in accordance with embodiments of the present invention.

FIG. 5 illustrates an instruction timing cache graph 500, in accordance with embodiments of the present invention. In timing cache graph 500, each node N represents an instruction. The node numbers correspond to the instruction address as shown in exemplary instruction sequence 400 of FIG. 4A. Each edge E(N1, N2) between two nodes N1 and N2 represents the instruction timing when, for a given "Instruction Timing Event," instruction N1 is followed by instruction N2. The amount of neighbor instructions to consider and therefore the size of the instruction timing cache graph 500 depends on the processor architecture and the instructions being executed.

Timing cache graph 500 may be used for complex processor architectures where the Timing Events can influence the timing of the instructions that come after it. In such a case, timing cache 460 may return the wrong timing, since timing cache 460 may be built on an assumption that the timing of an instruction is only a function of the Timing Events of that instruction, which is not the case when multiple instructions influence each other's timing.

Each edge of timing cache graph 500 represents the timing of the instruction it points to for certain Timing Events. As with timing cache 460 (FIG. 4B), timing cache graph 500 may be constructed during accurate simulation, e.g., cycle accurate simulation. During graph construction it should be ensured that no node has incoming edges with the same Timing Events and different Instruction timing. This situation may occur if one instruction influences the timing of another instruction. If such situation occurs, an additional node is created for the instruction, which might result in a partial unrolling of the graph, as can be seen in the example. The instruction at address 24 is in this case causing the graph to unroll for instructions 12, 16, 20 and 24.

A switch to a faster, but less accurate simulator, e.g., an instruction accurate simulation, may be performed when the edge for the instruction, with the current combination of events, already exists, that is, the timing of the instruction is already known.

During less accurate simulation, timing cache graph 500 is traversed and the timing of the traversed edges are used as instruction timing. When no edge can be found for a certain instruction, the simulator switches to an accurate simulation to create the edge.

Figure 6A:
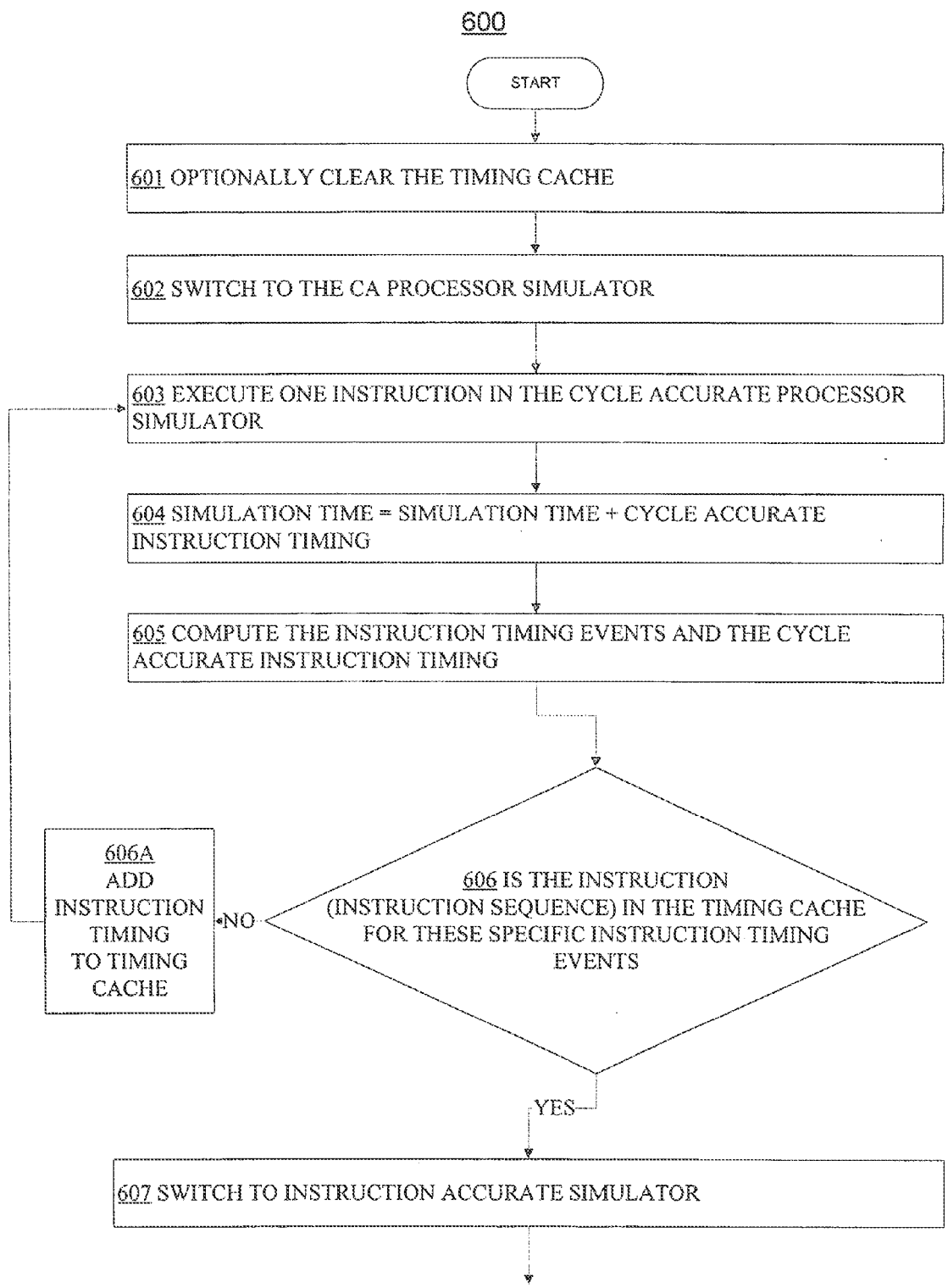
FIGS. 6A and 6B illustrate a flow chart of an exemplary method for performing simulation in "approximate" mode, in accordance with embodiments of the present invention.
Figure 6B:
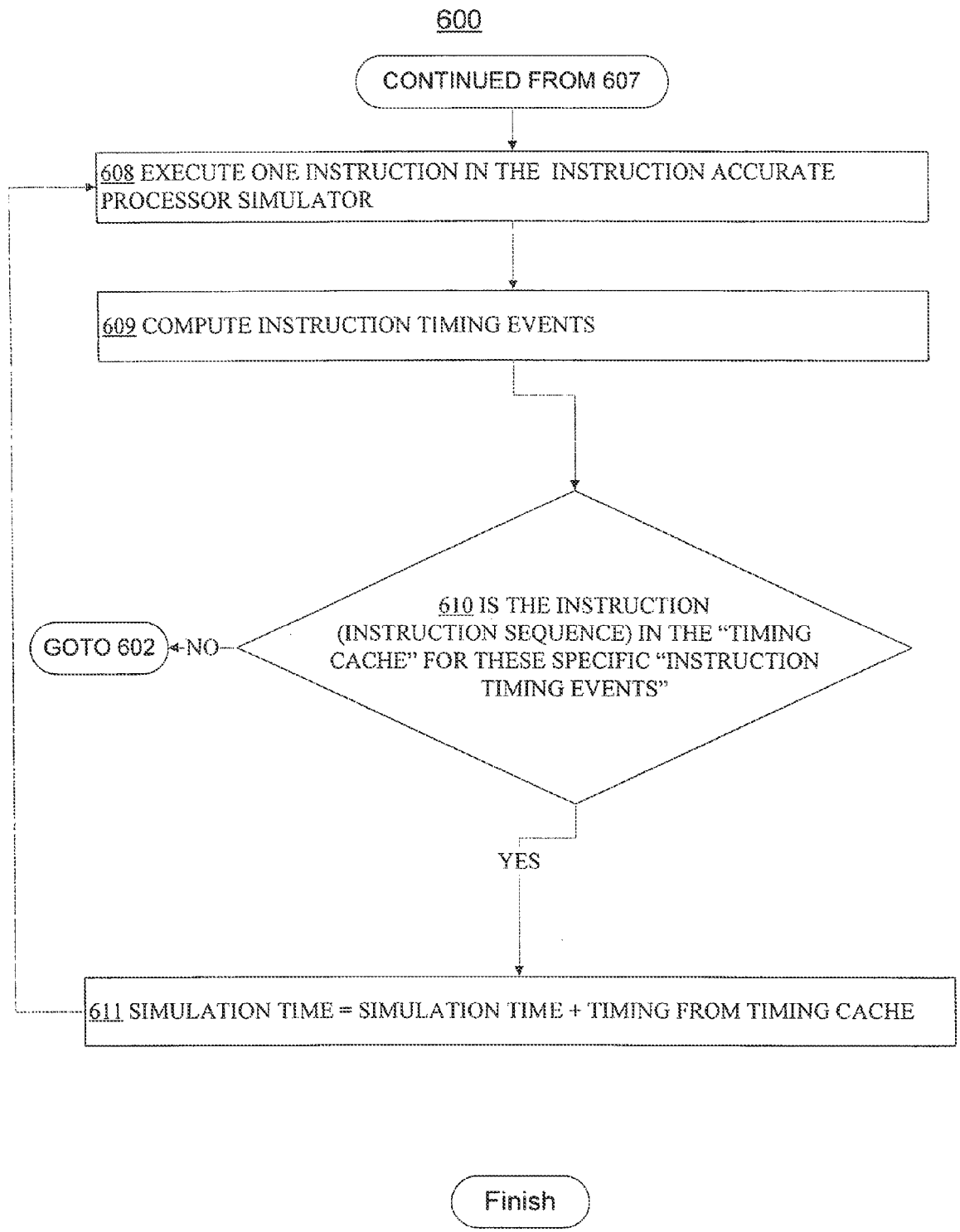

FIGS. 6A and 6B illustrate a flow chart of an exemplary computer-implemented method 600 for performing simulation in "approximate" mode, in accordance with embodiments of the present invention. The actions of method 600 may be performed or initiated by a speed and accuracy trade-off engine (SATE), e.g., SATE 380 of FIG. 3. In optional 601, a timing cache is cleared. Exemplary timing caches include timing cache 460 of FIG. 4B, and timing cache graph 500 of FIG. 5. In 602, simulation is switched to a cycle accurate simulator. It is appreciated that the previous simulator may have been the same cycle accurate simulator, in accordance with embodiments of the present invention.

In 603, one instruction is executed (or simulated) in the cycle accurate processor simulator. This simulation provides instruction timing. In optional 604, a simulation time counter is updated. The total simulation time is equal to the previous total simulation time plus the new instruction timing, provided by the cycle accurate simulation. In 605, the instruction timing events and the cycle accurate instruction timing are computed.

In 606, the timing cache is checked to determine if the instruction timing, or timing for an instruction sequence, is in the timing cache. If the instruction timing is not in the timing cache, the instruction timing is placed in the timing cache, and process flow continues at 603. If the instruction timing is in the timing cache, then process flow continues at 607.

In 607, simulation is switched to an instruction accurate simulator. In 608, one instruction is executed (or simulated) in the instruction accurate processor simulator. In 609, the instruction timing events for the instruction are computed. It is appreciated that the instruction accurate simulation does not provide instruction timing. However, the instruction accurate simulation does provide information of timing events.

In 610, the timing cache is checked to determine if the instruction timing, or timing for an instruction sequence, is in the timing cache. If the instruction timing is not in the timing cache, process flow continues at 602. For example, if the instruction, with the corresponding timing events, has not been previously simulated by a cycle accurate simulation, then accurate timing information has not been placed in the timing cache. The instruction should be simulated by the cycle accurate simulation model. If the instruction timing is in the timing cache, then process flow continues at 611.

In optional 611, a simulation time counter is updated. The total simulation time is equal to the previous total simulation time plus the instruction timing, obtained from the timing cache.

In this novel manner, a majority of instruction executions may be simulated by a fast simulation method, e.g., instruction accurate simulation. While most individual instructions will be simulated in an accurate simulation model, e.g., a cycle accurate model, for their first execution, subsequent executions of the same instruction may typically be simulated by a fast simulation method. As the majority of instructions are executed multiple times, e.g., within looping structures, embodiments in accordance with the present invention provide for a high degree of simulation accuracy with a multi-order increase in simulation speed, in comparison to the conventional art.

If the process of switching between cycle accurate and instruction accurate simulation is considered expensive, e.g., the switch takes too long and/or consumes excessive processing resources, the following optimizations may be of benefit. A delay mechanism may be added to 606 such that N consecutive instruction "hits" in the timing cache are required before proceeding to 607. Such a delay mechanism may prevent churn. In addition, it is generally straight forward to determine the timing of some instructions, e.g., increment or rotate instructions. For such instructions, it may not be necessary to store and/or retrieve their timing from a timing cache. Rather, their timing can be computed directly in 609, e.g., via a formula which is a function of the instruction and its events.

In accordance with an alternative embodiment in accordance with the present invention, a "fast but less accurate" simulation, e.g., an instruction accurate simulation, may be run continuously, and a "slow but accurate" simulation, e.g., a cycle accurate simulation, may be run in parallel when necessary to collect timing information.

For example, an instruction sequence may be simulated by both cycle accurate and instruction accurate simulation models, e.g., instruction accurate model 320 and cycle accurate model 330 as illustrated in FIG. 3. If instruction timing information for a next instruction to be simulated has not already been recorded, e.g., in a timing cache data structure, e.g., timing cache data structure 460 (FIG. 4B) or timing cache graph 500 (FIG. 5), then both simulation models simulate the instruction, and the timing information provided by the cycle accurate simulation model is added to a timing cache data structure.

If the next instruction to be simulated has been previously simulated, e.g., timing information is in a timing cache data structure, then the instruction may be simulated only by the instruction accurate simulation model.

It is to be appreciated that running an instruction accurate model in parallel with a cycle accurate model generally does not result in a disadvantageous increase in simulation duration over the time required for the cycle accurate simulation alone. It may be desirable to synchronize simulated execution of instructions in the two simulation models, e.g., to simulate the same instruction in each simulation model before either simulates a next instruction. Alternatively, the faster model, e.g., an instruction accurate model, may wait for the slower model, e.g., a cycle accurate model, to catch up at an advantageous point. Such a catch-up point may be a point after previously simulated code at which the cycle accurate simulation model is needed again. Beneficially, state information never has to be transferred to the instruction accurate model, as it is running for the entire simulation. Generally, some state information may have to be transferred to the cycle accurate model when it starts simulating a new portion of code.

Embodiments in accordance with the present invention provide for systems and methods for simulation with dynamic run-time accuracy adjustments. Embodiments in accordance with the present invention also provide for systems and methods for simulation performed early in a design process in conjunction with the above. Further, embodiments in accordance with the present invention provide for systems and methods for systems and methods for simulation with dynamic run-time accuracy adjustment that are compatible and complementary with existing systems and methods of software simulation.

Various embodiments of the invention are thus described. While the present invention has been described in particular embodiments, it should be appreciated that the invention should not be construed as limited by such embodiments, but rather construed according to the below claims.

What is claimed is:

1. A computer implemented simulation method comprising:
during a simulation, simulating a first portion of a sequence of instructions by a first simulation model of a processor;
during the simulation, receiving an accuracy control input from a debugger and switching from the first simulation model of the processor to a second simulation model of the processor responsive to the accuracy control input from the debugger, the second simulation model providing a different simulation speed and accuracy than the first simulation model; and
during the simulation, simulating a second portion of the sequence of instructions by the second simulation model of the processor upon switching from the first simulation model to the second simulation model.

2. The method of claim 1, wherein the first simulation model is a cycle accurate simulation model of the processor and the second simulation model is an instruction accurate simulation model of the processor, the simulation switched from cycle accurate simulation model to the instruction accurate simulation model responsive to the accuracy control input.

3. The method of claim 1, wherein the first simulation model is an instruction accurate simulation model of the processor and the second simulation model is a cycle accurate simulation model of the processor, the simulation switched from the instruction accurate simulation model to the cycle accurate simulation model responsive to the accuracy control input.

4. The method of claim 1, further comprising:
transferring state information from the first simulation model of the processor to the second simulation model of the processor when switching from the first simulation model of the processor to the second simulation model of the processor.

5. The method of claim 4, wherein the transferred state information comprises all state variables of the first simulation model.

6. The method of claim 4, wherein the transferred state information comprises less than all state variables of the first simulation model.

7. The method of claim 4, wherein transferring the state information comprises:
tracking changed states in the state information of the first simulation model; and
transferring the changed states of the state information to the second simulation model.

8. The method of claim 4, further comprising:
storing a history of events that change state; and
upon switching from the first simulation model to the second simulation model, replaying the history of events that change state in the second simulation model.

9. The method of claim 1, wherein the accuracy control input corresponds to a user selected setting.

10. The method of claim 1, wherein the first simulation model is switched to the second simulation model at a point in simulation when operating system initialization is complete.

11. A computer storing logic that is executed by the computer to:
during a simulation, simulate a first portion of a sequence of instructions by a first simulation model of a processor;
during the simulation, receive an accuracy control input from a debugger and switching from the first simulation model of the processor to a second simulation model of the processor responsive to the accuracy control input from the debugger, the second simulation model providing a different simulation speed and accuracy than the first simulation model; and
during the simulation, simulate a second portion of the sequence of instructions by the second simulation model of the processor upon switching from the first simulation model to the second simulation model.

12. The computer of claim 11, wherein the first simulation model is a cycle accurate simulation model of the processor and the second simulation model is an instruction accurate simulation model of the processor, the simulation switched from cycle accurate simulation model to the instruction accurate simulation model responsive to the accuracy control input.

13. The computer of claim 11, wherein the first simulation model is an instruction accurate simulation model of the processor and the second simulation model is a cycle accurate simulation model of the processor, the simulation switched from the instruction accurate simulation model to the cycle accurate simulation model responsive to the accuracy control input.

14. The computer of claim 11, wherein the logic is further executed to:
transfer state information from the first simulation model of the processor to the second simulation model of the processor when switching from the first simulation model of the processor to the second simulation model of the processor.

15. The computer of claim 14, wherein the transferred state information comprises all state variables of the first simulation model.

16. The computer of claim 14, wherein the transferred state information comprises less than all state variables of the first simulation model.

17. The computer of claim 14, wherein transferring the state information comprises:
tracking changed states in the state information of the first simulation model; and
transferring the changed states of the state information to the second simulation model.

18. The computer of claim 14, wherein the logic is further executed to:
store a history of events that change state; and
upon switching from the first simulation model to the second simulation model, replay the history of events that change state in the second simulation model.

19. The computer of claim 11, wherein the accuracy control input corresponds to a user selected setting.

20. The computer of claim 11, wherein the first simulation model is switched to the second simulation model at a point in simulation when operating system initialization is complete.

* * * * *